United States Patent [19]
Sandhu

[11] Patent Number: 5,781,051
[45] Date of Patent: Jul. 14, 1998

[54] POWER-UP DETECTOR FOR LOW POWER SYSTEMS

[75] Inventor: Bal S. Sandhu, Fremont, Calif.

[73] Assignee: Exel Microelectronics, Inc., San Jose, Calif.

[21] Appl. No.: 687,763

[22] Filed: Jul. 26, 1996

[51] Int. Cl.$^6$ ......................................................... H03L 7/00
[52] U.S. Cl. ........................................... 327/143; 327/198
[58] Field of Search ..................................... 327/142, 143, 327/198, 427, 530, 574

[56] References Cited

U.S. PATENT DOCUMENTS

| | | | |
|---|---|---|---|
| 4,697,097 | 9/1987 | Rusznyak | 327/143 |
| 5,187,389 | 2/1993 | Hall et al. | 327/143 |
| 5,442,312 | 8/1995 | Walter | 327/143 |
| 5,528,182 | 6/1996 | Yokosawa | 327/143 |
| 5,528,184 | 6/1996 | Gola et al. | 327/143 |

*Primary Examiner*—Toan Tran
*Attorney, Agent, or Firm*—Limbach & Limbach L.L.P.

[57] ABSTRACT

A power-up reset detector circuit is described which uses the threshold voltages of NMOS and PMOS transistors to detect the power-up of integrated circuits, and uses a current mirror to track power supply and process variations.

20 Claims, 6 Drawing Sheets

POWER-UP DETECTOR FOR LOW POWER SYSTEMS

TECHNICAL FIELD

The present invention is directed generally to power-up detection circuitry, and more particularly to a power-up detection circuit which does not rely upon the energy transferred across a coupling capacitor or the beta ratio of back-to-back inverters.

BACKGROUND ART

The present invention is useful in integrated circuits that include data storage elements such that in order to protect the integrity of the stored data the chip has to remain in a disabled state until the power supply reaches some known stable value. In most cases, it is desirable to keep internal registers and timing circuits in a reset condition in order to prevent the chip from performing any functions until the power supply has been stabilized. This is to ensure that the chip always starts in a known condition. For example, the chip timing circuits normally will start from a count of zero. During power-up, a cross-coupled latch circuit can come up in any state. If the cross-coupled latch comes up in the wrong state, this could change the state of internal registers and counters used in timing and thereby change the functionality of the part.

Figure 1:
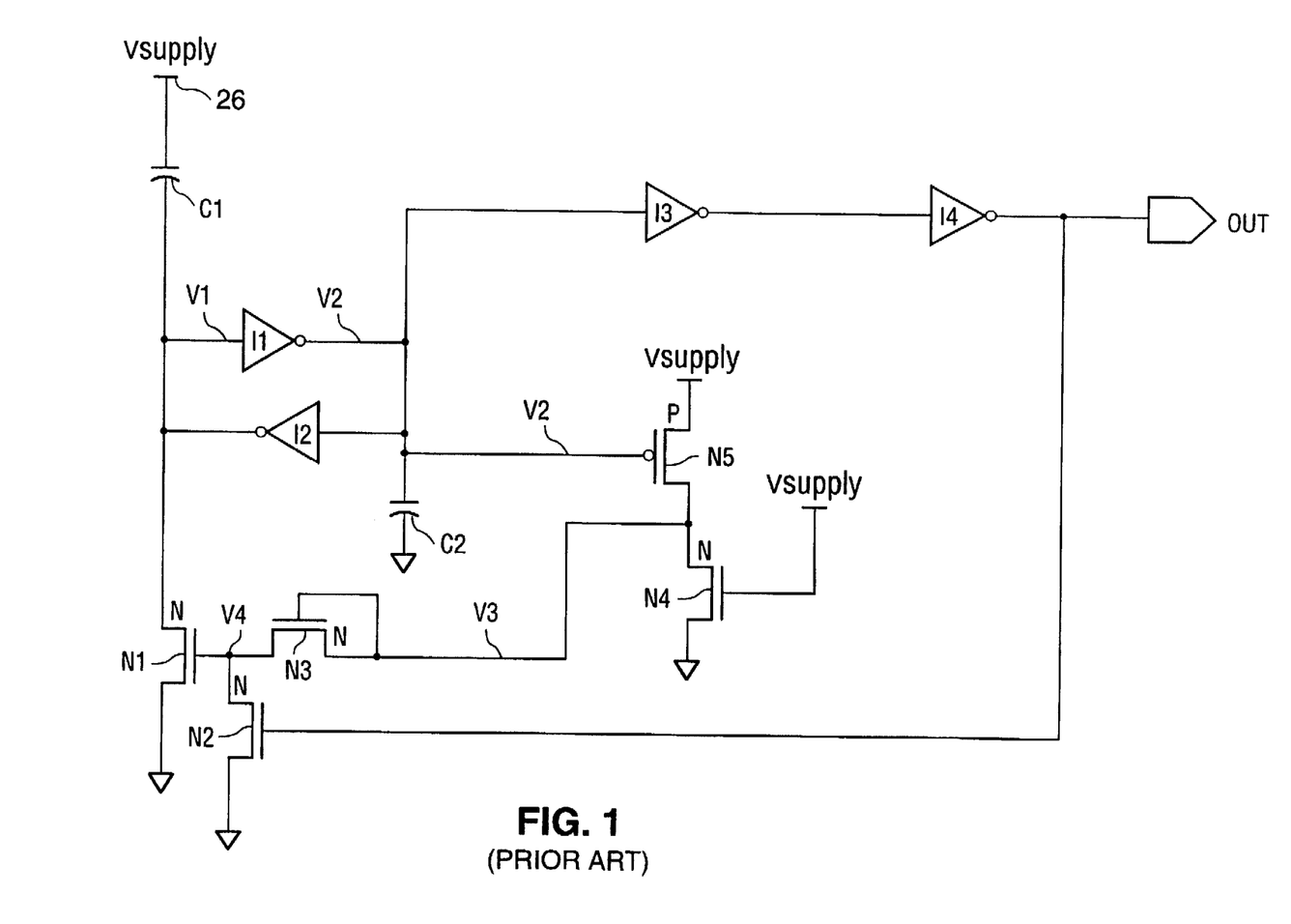
FIG. 1 is schematic diagram of a prior art power-up reset circuit.

In most systems where memory elements are employed, it is necessary to ensure that there is no inadvertent writing of data to the memory elements while the system is powered up. This is achieved by the use of power-up reset circuits to ensure that the system has stabilized before other circuit functions are enabled. A typical conventional power-up reset circuit is illustrated in FIG. 1. However, this type of circuit suffers from two main disadvantages as follows.

The first disadvantage is that it depends upon the amount of energy transferred across the coupling capacitor $C_1$ as the $V_{cc}$ power supply, $V_{supply}$, is rising. The amplitude of the energy transfer is largely a function of the "rate" at which the $V_{cc}$ power is changing, which rate can vary from a few hundred microseconds to several milliseconds. In FIG. 1, the amplitude to which node $V_1$ rises will determine the trip point of the circuit Thus, the circuit is susceptible to noise spikes and may not respond to a very slowly rising power supply level.

Secondly, in FIG. 1, the beta ratio of the latch created by back-to-back inverters $I_1$ and $I_2$ has to be very carefully designed so that the nodes $V_1$ and $V_2$ come up in the correct state during the power-up process. Hence, the beta ratio has to allow the coupling capacitor $C_1$ to couple node $V_1$ high and capacitor $C_2$ to couple node $V_2$ low until the feedback voltage $V_4$ on the gate of transistor $N_1$ exceeds the threshold voltage $V_r$. This causes $N_1$ to turn on and pull node $V_1$ back down to a low state, and the output of the circuit to go to a high state.

If instead, the beta ratio were not correct, inverter $I_1$ might start out with a logic one output which would cause inverter $I_2$ to prevent $V_1$ from going positive during power-up. This would also prevent $N_5$ from turning on and hence prevent feedback voltage $V_4$ from exceeding the threshold voltage of $N_1$, and thereby prevent the flipping of the latch.

It would therefore be desirable to have a power-up detection circuit which does not depend primarily upon energy tranferred across a coupling capacitor or the beta ratio of back-to-back inverters for proper operation.

SUMMARY OF THE INVENTION

The above and other problems and disadvantages of the present invention are overcome by the present invention of a circuit for detecting a power-up condition on a supply voltage line including a power detect circuit, a current mirror circuit, an amplifier, and an output latch/power-down circuit. The power detect circuit provides a disable signal when power is initially applied to the supply voltage line. The current mirror disables the power detect circuit, and provides an output signal and a control signal, when a voltage on the supply voltage line exceeds a predetermined threshold level. The amplifier is controlled by the disable signal from the power detect circuit and the control signal from the current mirror, and is coupled to receive the current mirror output signal. The amplifier provides a drive signal proportional to the current mirror output signal. The output latch/power-down circuit is disabled by the disable signal from the power detect circuit and enabled by the drive signal from the amplifier. The power-down/latch circuit decouples the power detect circuit, the current mirror, and the amplifier from the supply voltage line, and provides a reset output signal upon receipt of the drive signal from the amplifier.

In accordance with the present invention, better control of the power-up reset function is obtained, and in a manner independent of the slew rate of the $V_{cc}$ (supply voltage) power.

It is therefore an object of the present invention to provide a power-up reset circuit which is independent of the slew rate of the power supply voltage.

It is another object of the present invention to provide a power-up reset circuit which does not depend upon the beta ratio between back-to-back inverters.

It is a further object of the present invention to provide a power-up reset circuit which relies primarily upon transistor threshold voltages for setting internal threshold levels.

These and other objectives, features and advantages of the present invention will be more readily understood upon consideration of the following detailed description of the present invention and accompanying drawings.

DETAILED DESCRIPTION OF THE INVENTION

Figure 2:
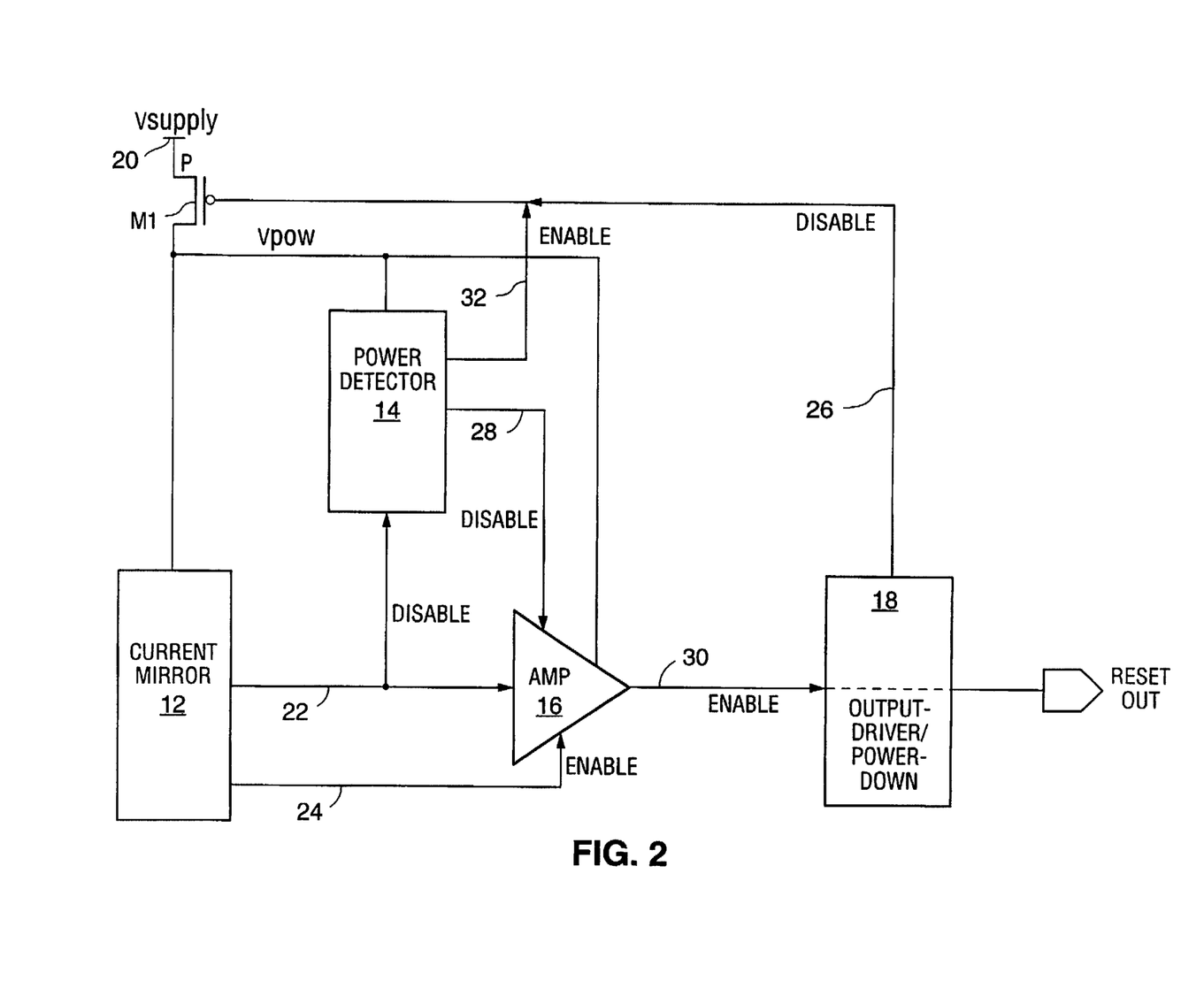
FIG. 2 is a simplified functional block diagram of one embodiment of the present invention.

FIG. 2 provides a simplified functional block diagram of one embodiment of the present invention. The circuit has four main circuit blocks: a current mirror 12, a power detector 14, an amplifier 16, and an output-driver/power-down stage 18. The current mirror 12, power detector 14, and amplifier 16 are coupled to the supply voltage line 20, $V_{supply}$ by way of transistor M1.

When power is initially applied to the supply voltage line 20, power-up detector 14 generates a signal on line 28 which is applied to temporarily disable amplifier 16, and a signal on line 32 to temporarily maintain transistor $M_1$ in an ON state.

As the voltage level on the supply voltage line 20 rises further, current mirror 12 becomes operable and provides an output signal on line 22 and an enable (or control signal) signal on line 24. The output signal on line 22 disables the power detector 14 and overrides its disable signal on line 28, and the enable signal on line 32. At the same time the output signal on line 22 is amplified by amplifier 16 which at the same time is enabled by the enable signal on line 24.

The amplified signal from amplifier 16 operates to enable the output-driver/power-down stage 18, which in turn provides the reset output of the overall circuit, and also disables transistor $M_1$ by applying a disable signal to the gate of transistor $M_1$ via line 26 after the power up trip point voltage is reached. This removes power from the current mirror 12, power detector 14, and amplifier 16 circuitry, to reduce the power consumed thereafter by the power-up reset circuit of the present invention.

Figure 3:
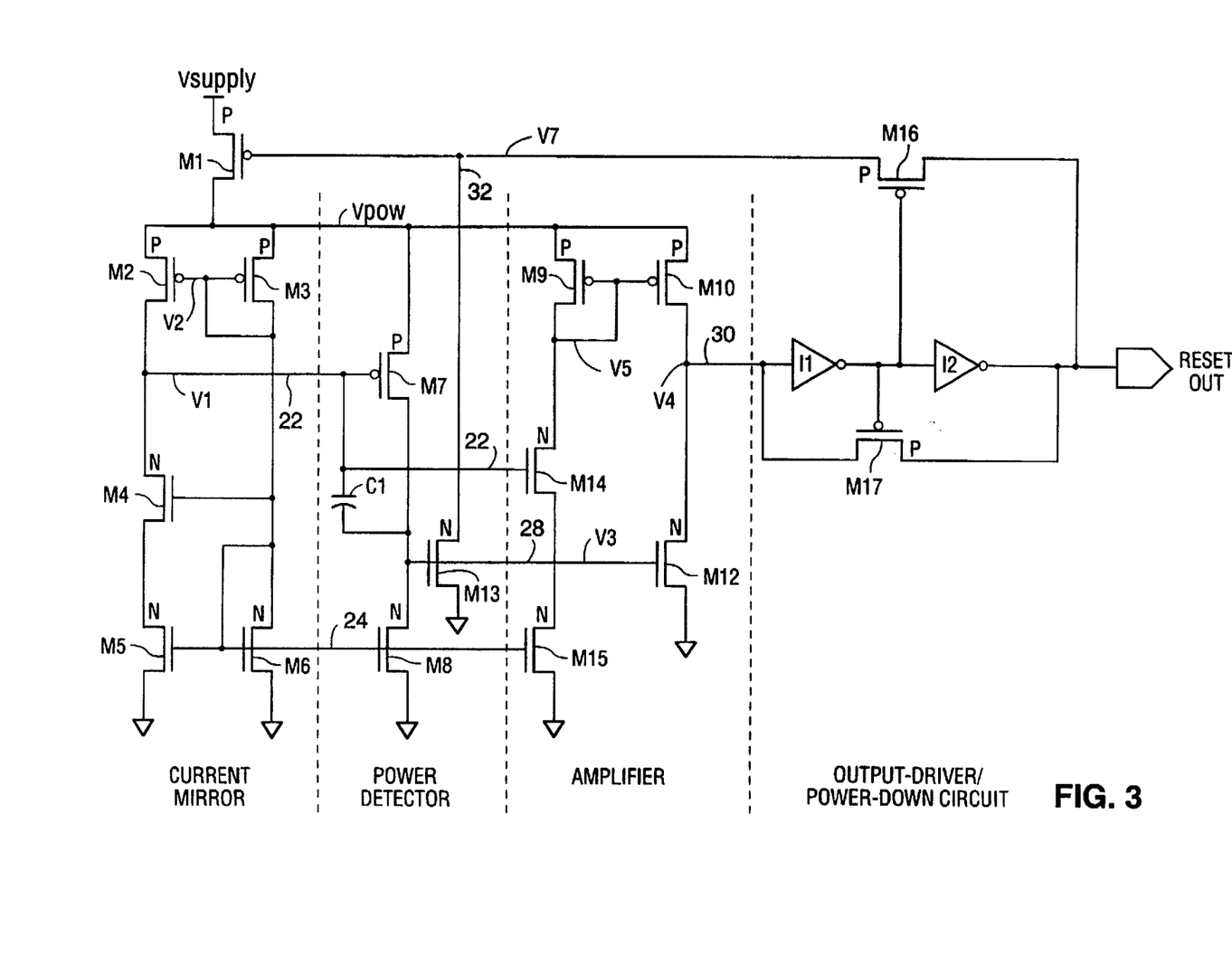
FIG. 3 is a more detailed schematic of the embodiment of the power-up reset circuit of the present invention illustrated in FIG. 2.

Referring now to FIG. 3, a more detailed schematic diagram of the preferred embodiment of the present invention is provided and will now be described. The circuitry in the schematic diagram of FIG. 3 is grouped generally according to the functional blocks of FIG. 2. Like signals and components between the two figures will be referred to by the same reference designations and names.

The current mirror 12 is formed by p-channel field effect transistors ("PFETs") $M_2$ and $M_3$ and n-channel field effect transistors ("NFETs") $M_4$, $M_5$, and $M_6$. Transistor $M_3$ is diode-connected with its source connected to the drain of PFET $M_1$ at node Vpow. Transistor $M_2$ has its gate connected to the gate of $M_3$ and its source connected to node Vpow. Transistor $M_6$ is diode-connected with its source connected to ground and its drain connected to the drain of transistor $M_3$. The gate of transistor $M_5$ is connected to the gate of transistor $M_6$ and to line 24, and its source is connected to ground. Transistor $M_4$ controls the signal path between the drain of transistor $M_2$ and the drain of transistor $M_5$, and has a gate which is connected to be controlled by the voltage level at the junction of the drains of transistors $M_3$ and $M_6$.

The power detector 14 is formed by PFET $M_7$, NFETs $M_8$ and $M_{13}$, and capacitor $C_1$. The source of $M_7$ is connected to node Vpow, its gate is connected to receive the output signal from current mirror 12 on line 22, and its drain is connected to the drain of $M_8$. Capacitor $C_1$ is connected between the gate and drain of $M_7$. The gate of transistor $M_{13}$ is connected to the drain of transistor $M_7$, its source is connected to ground, and its drain is connected to the gate of $M_1$ via line 32.

The amplifier 16 in the embodiment of FIG. 3 is a voltage gain stage formed by PFETs $M_9$ and $M_{10}$, and NFETs $M_{12}$, $M_{14}$, and $M_{15}$. Transistor $M_9$ is diode-connected, with its source connected to node Vpow. The source of transistor $M_{10}$ is also connected to node Vpow, while its gate is connected to the gate of transistor $M_9$. The sources of transistors $M_{12}$ and $M_{15}$ are connected to ground, with the drain of transistor $M_{12}$ being connected to the drain of transistor $M_{10}$. The gate of transistor $M_{15}$ is connected to line 24 from current mirror 12, while the gate of transistor $M_{12}$ is connected to the drain of $M_7$ via line 28. Finally, transistor $M_{14}$ controls the signal path between the drains of transistors $M_9$ and $M_{15}$, and is controlled by the signal on line 22.

The output-driver/power-down stage 18 is formed by inverters $I_1$ and $I_2$, and PFETs $M_{16}$ and $M_{17}$. Inverter $I_1$ receives a signal on line 30 from the junction of the drains of $M_{10}$ and $M_{12}$, and in turn drives inverter $I_2$. The gates of $M_{16}$ and $M_{17}$ are both connected to the output of inverter $I_1$, and their sources are both connected to the output of inverter $I_2$. The source of $M_{17}$ is used to feedback the reset output signal to the input of $I_1$ when the output of inverter $I_1$ is low.

Figure 4A:
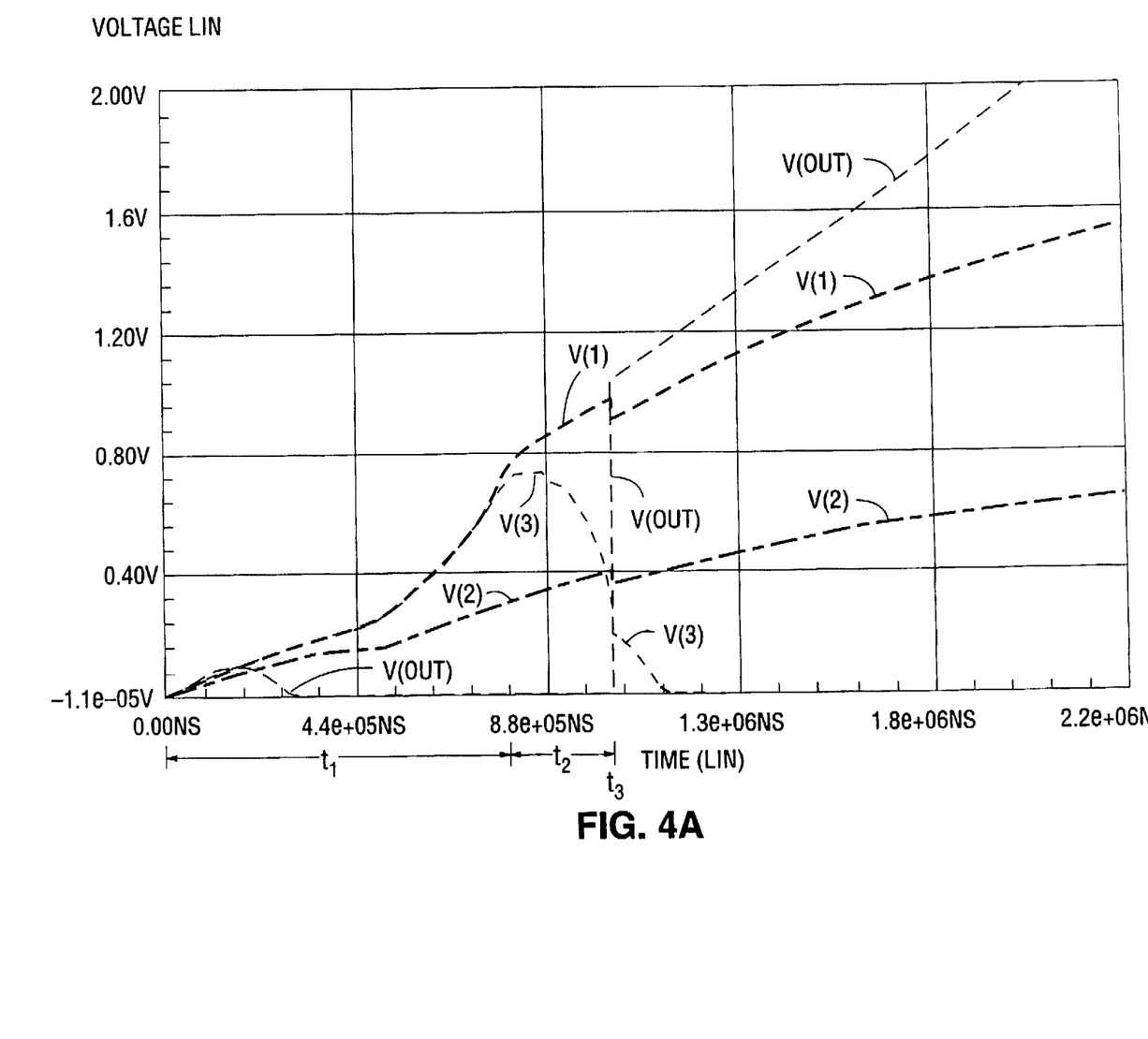
FIG. 4A is a simulation of the voltages at selected nodes of the circuit of FIG. 3 during a power-up condition.

Referring to FIGS. 3 and 4A, the operation of the circuitry of FIG. 3 will now be described. Initially, all nodes in the circuit are at 0 volts. As the power-up process begins, the source of transistor $M_1$ receives power from $V_{supply}$ and $M_1$ begins to supply power to the current mirror 12, power detector 14, and amplifier 16. At this point in time, node Vpow is ramping toward $V_{cc}$. When node Vpow reaches the PFET threshold voltage, $V_{pt}$, transistors $M_2$, $M_3$, $M_9$, and $M_{10}$ begin to turn on.

Transistor $M_7$, however, is designed to have a turn-on rate which is faster that that for $M_2$, $M_3$ and $M_9$ and $M_{10}$, such as can be obtained by making the physical size of $M_7$ larger than that of $M_2$, $M_3$, $M_9$ or $M_{10}$. This allows the voltage at node V3 to rise with $V_{supply}$ and to cause transistors $M_{12}$ and $M_{13}$ to turn on once the voltage on node V3 has reached the NFETs threshold voltage, $V_{tn}$. In the example of FIG. 4A, voltage V3 is shown ramping up to approximately 0.7 V during this time frame, t1. In turn, during time period t1, this keeps the voltage at node V4 low, and also turns on transistor $M_{13}$ to keep transistor $M_1$, on. Thus, initially, the Reset Output level will be low. In FIG. 4A, this is shown by the dashed line labelled V(out), which is at or near the horizontal axis of the graph during period t1.

During this period t1 the voltage on nodes V2 and V5 will be rising, but at a slower rate than the voltage at node V3. As $M_7$ turns on, node V3 will follow the voltage Vpow-$V_{tp}$, where $V_{tp}$ is the PFET threshold voltage of transistor $M_7$. Normally, $V_{tn}<V_{tp}$, hence as $M_7$ turns on, the voltage at node V3, Vpow-$V_{tp}$, will be greater than Vtn thereby turning on transistors $M_{12}$ and $M_{13}$ and keeping node V4 low.

As Vpow continues to increase towards $V_{supply}+V_{tp}$, current mirror 12 will begin to become operational. This will cause the voltage at node V1 to increase to a point where the gate-source voltage across $M_7$ begins to drop below $V_{tp}$, thereby causing $M_7$ to begin to turn off. This can be seen to occur during time period t2 of FIG. 4A.

More specifically, the voltage V2 in current mirror 12 initially will follow Vpow-$V_{tp}$, and then cause transistor $M_4$ to turn on once Vpow-$V_{tp}$ has reached $V_{tn}$. This occurs at time t3 in FIG. 4A. Preferrably, the current flowing in leg $M_3$-$M_6$ is twice (2X) the current in $M_2$-$M_5$, and is set to control the trip point (the point at which the power detector 14 is disabled) of transistors $M_7$ and $M_8$. In otherwords, by proper ratioing of the current in leg $M_3$-$M_6$ to the current in leg $M_2$-$M_5$, the voltage at node V1 can be controlled as a function of the level of Vpow-$V_{tp}$, and hence the point at which power detector 14 is disable can be controlled.

In operation, $M_4$ prevents current from flowing into $M_5$ until the gate of $M_4$ reaches the $V_{tn}$ threshold level. At this point, Vpow will be at $V_{tp}+V_{tn}$. Once $M_4$ begins to turn on, current will begin flowing into $M_5$ and the rate at which voltage V1 increases will be lower; however V1 continues to increase to ensure that $M_7$ will turn off. In the embodiment of FIG. 4A, V1 approaches and is eventually clamped at 2.6 V, at which point $M_7$ is turned off.

During time period t2, once $M_4$ is turned on, the current source formed by transistors $M_5$ and $M_6$ will begin to turn on transistors $M_8$ and $M_{15}$. As $M_8$ turns on, the voltage at node V3 starts to fall, and transistors $M_{12}$ and $M_{13}$ begin to turn off. With $M_{15}$ now turning on, $M_{14}$ can begin to turn on, since the gate of $M_{14}$ in amplifier 16 will already be above $V_m$. This permits the voltage on node V5 to begin to fall which causes transistor $M_{10}$ to turn on. With $M_{12}$ and $M_{10}$ turning on and off, this permits the voltage on node V4 to rise, and thereby trigger output-driver/power-down stage 18 to output the reset output signal at time t3.

In other words, as Vpow reaches $V_{tp}+V_m$ during time t2, transistors $M_7$ is turning off and transistor $M_8$ is turning on. This causes the voltages at nodes V3 and V5 to fall, which in turn causes transistor $M_{12}$ to turn off and $M_{10}$ to turn on. This causes the voltage at node V4 to rise and trip the state of the circuit.

Therefore, the circuit will "trip" when Vpow is close to $V_{tp}+V_m$.

When the trip point of the circuit is reached, the voltage on node V4 will rise to $V_{supply}$. This will force the output of inverter $I_1$ to go low, and turn on the PFET transistors $M_{16}$ and $M_{17}$. Inverter $I_2$ provides the output drive for the circuit and follows the state of node V4. When transistors $M_{16}$ and $M_{17}$ are turned on, $M_{17}$ will feed back the output level of the circuit to the gate of transistor $M_1$, to turn it off. This decouples the current mirror 12, power detector 14, and amplifier 16 from $V_{supply}$ and powers them down so that these stages thereafter consume no power. Transistor $M_{16}$ feeds back the output voltage of the circuit to the input of inverter $I_1$ to keep the $I_1$ and $I_2$ latched in their current state.

Table 1 provides an illustrative list of the relative sizes of the transistors in FIG. 3.

TABLE 1

| Transistor | Type | Size |
|---|---|---|
| M1 | NFET | 50/2 |
| M2 | NFET | 20/10 |
| M3 | NFET | 20/10 |
| M4 | NFET | 40/3 |
| M5 | NFET | 10/10 |
| M6 | NFET | 15/10 |
| M7 | NFET | 40/5 |
| M8 | NFET | 5/10 |
| M9 | NFET | 20/10 |
| M10 | NFET | 20/10 |
| M12 | NFET | 10/6 |
| M13 | NFET | 3/6 |
| M14 | NFET | 20/3 |
| M15 | NFET | 5/10 |
| M16 | PFET | 3/12 |
| M17 | PFET | 3/10 |

Figure 4B:
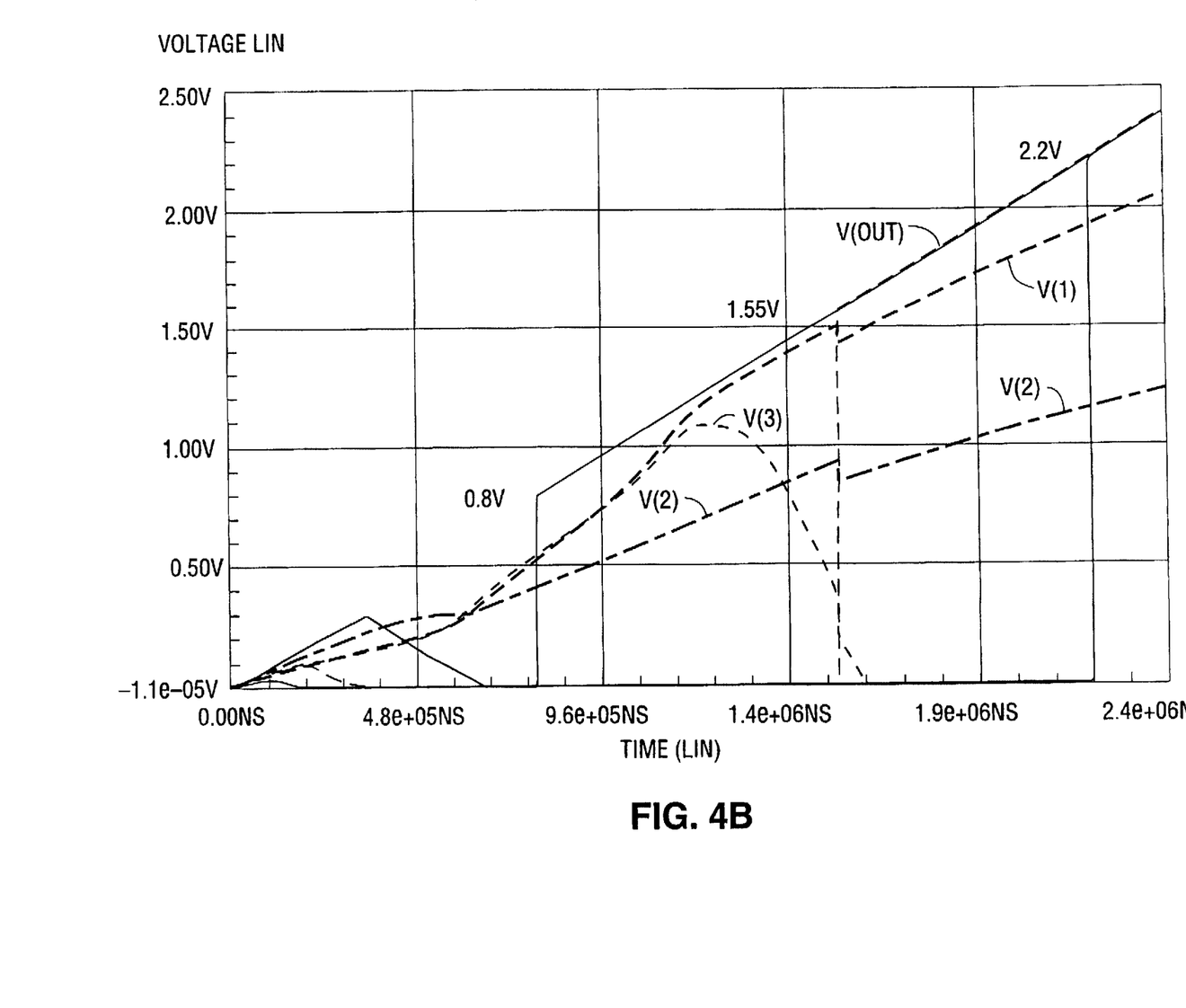
FIG. 4B is a simulation of the voltages at selected nodes of the circuit of FIG. 3 during a power-up condition, over different temperatures.

FIG. 4B illustrates the output response of the circuit of FIG. 3 for different supply voltages and temperatures.

In the amplifier 16 stage of FIG. 3, capacitor $C_1$ is useful when $V_{supply}$ is at very low levels, such as below 2.0 V. Capacitor $C_1$ operates to couple the change in level of Vpow as the circuit is powered up, to the gates of $M_{12}$ and $M_{13}$ in order to assist $M_7$ in turning them on.

Figure 5:
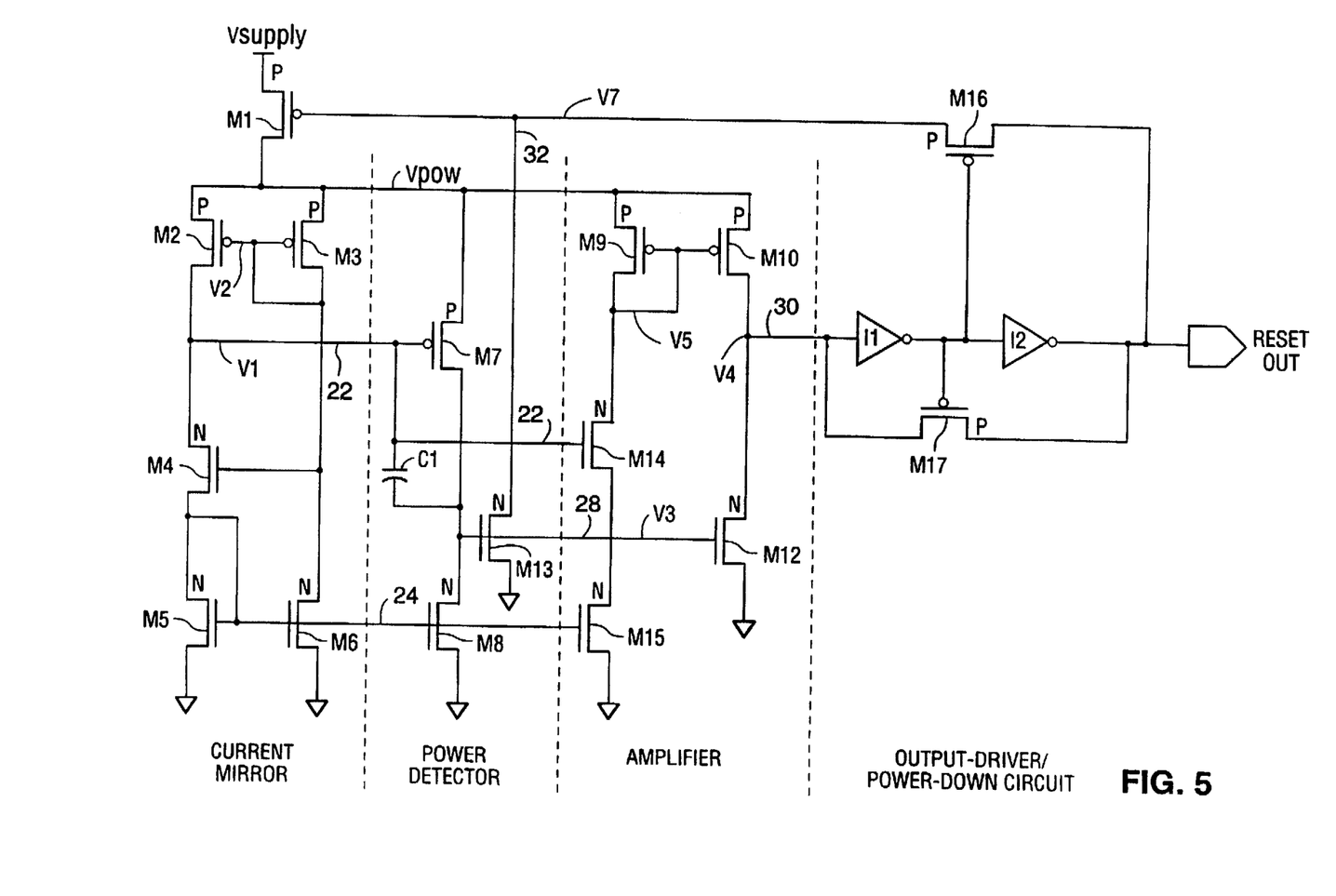
FIG. 5 is a more detailed schematic of the embodiment of the power-up reset circuit of the present invention illustrated in FIG. 2, where the threshold voltage is set to be approximately $V_{tp}+2V_{tn}$.

FIG. 5 illustrates another embodiment of the present invention in which transistor $M_5$, instead of $M_6$, of current mirror 12 is diode-connected. In this configuration, both $M_5$ and $M_4$ will have to turn on before current mirror 12 become operational. This results in an increase in the trip point voltage by an additional $V_m$. Therefore, while the trip point of the circuit of FIG. 3 is close to $V_{tp}+V_m$, the trip point of the circuit of FIG. 5 will be closer to $V_{tp}+2V_m$.

While the embodiments of FIGS. 2, 3 and 5 show the supply voltage line 20 coupled to Vpow through transistor $M_1$, it is to be understood that the invention can be practiced without the use of $M_1$, where it is not desired to power down the circuitry following issuance of the reset output. In that case, for example, the output-driver/power-down stage 18 may also not be necessary, and amplifier 16 might be used as the output circuit for the invention. Furthermore, while these figures also show the use of amplifier 16, it is to be understood that different amplifiers, or no amplifier at all, may be used within the spirit of the invention, depending upon the drive capabilities of the current mirror used and the requirements of the output-driver/power-down stage 18.

The terms and expressions which have been employed here are used as terms of description and not of limitation, and there is no intention, in the use of such terms and expressions, of excluding equivalence of the features shown and described, or portions thereof, it being recognized that various modifications are possible within the scope of the invention claimed.

What is claimed is:

1. A device for detecting power-up on a supply voltage line comprising a power detect circuit coupled to the supply voltage line and which provides a disable signal when operating power is initially applied to the supply voltage line;

a current mirror coupled to control the power detect circuit, wherein the current mirror provides a control signal and an output signal which disable the power detect circuit and which exceeds a predetermined control level when a voltage on the supply voltage line exceeds a predetermined threshold level; and an output circuit controlled by the disable signal and the control signal, and coupled to receive the current mirror output signal, wherein the output circuit provides a drive signal proportional to the current mirror output signal.

2. The device of claim 1 wherein the current mirror includes first and second current paths, wherein current flowing in the first current path is proportional to current flowing in the second path when the current mirror is operational; and a current controlling device positioned in the first current path and controlled by a voltage in the second current path.

3. The device of claim 1, wherein the power detect circuit, the current mirror, and the output circuit are controllably coupled to the supply voltage line, and further including a output-driver/power-down circuit coupled to the output circuit to be enabled by the drive signal from the output circuit, wherein the output-driver/power-down circuit decouples the power detect circuit, the current mirror and the output circuit from the supply voltage line and provides a reset output signal upon receipt of the drive signal from the output circuit.

4. The device of claim 1 wherein the power detect circuit comprises a gating transistor coupled to the voltage supply line and controlled by the output signal from the current mirror, wherein the gating transistor is sized to be operational at a lower voltage level on the supply voltage line than circuitry within the current mirror and the output circuit, and further wherein the gating transistor is operational in the absence of the output signal from the current mirror, and disabled in the presence of the output signal from the current mirror.

5. The device of claim 1 wherein the output circuit comprises first and second current paths, wherein current in the second current path is proportional to current in the first current path when the output circuit is operational; and a current gating transistor positioned to control current flowing in the first current path as a function of the output signal from the current mirror, and coupled to be disabled by the disable signal from the power detect circuit and enabled by the output signal from the current mirror.

6. The device of claim 3 wherein the current mirror includes first and second current paths, wherein current flowing in the first current path is proportional to current flowing in the second path when the current mirror is operational; and a current controlling device positioned in the first current path and controlled by a voltage in the second current path.

7. The device of claim 3 wherein the output-driver/power-down circuit includes a latch circuit which provides the reset output signal when enabled by the drive signal from the output circuit;

a decoupling circuit controlled by a state of the latch circuit which decouples the current mirror, the power detect circuit and the output circuit from the supply voltage line when the reset output signal is present.

8. The device of claim 3 further including a supply voltage transistor which provides a controllable path between the supply voltage line and the power detect circuit, the current mirror, and the output circuit, and further wherein the output-driver/power-down circuit includes a first inverter having an output connected to an input of a second inverter; and first and second feedback transistors, each coupled to be controlled by the output of the first inverter, wherein the first feedback transistor is coupled to provide a feedback path between an output of the second inverter and an input of the first inverter, and further wherein the second feedback transistor is coupled to provide a path from the output of the second inverter to the supply voltage transistor, so that the controllable path provided by the supply voltage transistor is controlled by a signal which is fed back by the second feedback transistor.

9. The device of claim 3 wherein the power detect circuit comprises a gating transistor coupled to the voltage supply line and controlled by the output signal from the current mirror, wherein the gating transistor is sized to be operational at a lower voltage level on the supply voltage line than circuitry within the current mirror and the output circuit, and further wherein the gating transistor is operational in the absence of the output signal from the current mirror, and disabled in the presence of the output signal from the current mirror.

10. The device of claim 3 wherein the output circuit comprises first and second current paths, wherein current in the second current path is proportional to current in the first current path when the output circuit is operational; and a current gating transistor positioned to control current flowing in the first current path as a function of the output signal from the current mirror, and coupled to be disabled by the disable signal from the power detect circuit and enabled by the output signal from the current mirror.

11. The device of claim 6 wherein the current mirror comprises first and second transistors of a first conductivity type, wherein one of the first and second transistors of the first conductivity type is diode-connected;

first and second transistors of a second conductivity type which is different from the first conductivity type, wherein one of the first and second transistors of the second conductivity type is diode-connected;

further wherein the diode-connected transistor of the first conductivity type is in the second current path and coupled to the supply voltage line, and the other transistor of the first conductivity type is in the first current path and coupled to the supply voltage line; and further wherein the diode-connected transistor of the second conductivity type is in the second current path and coupled to a circuit common ground point, and the other transistor of the second conductivity type is in the first current path and coupled to the circuit common ground point; and wherein the current controlling device is positioned in the first current path between the other transistor of the first conductivity type and the other transistor of the second conductivity type.

12. The device of claim 6 wherein the current mirror comprises first and second transistors of a first conductivity type, wherein one of the first and second transistors of the first conductivity type is diode-connected;

first and second transistors of a second conductivity type which is different from the first conductivity type, wherein one of the first and second transistors of the second conductivity type is diode-connected;

further wherein the diode-connected transistor of the first conductivity type is in the second current path and coupled to the supply voltage line, and the other transistor of the first conductivity type is in the first current path and coupled to the supply voltage line; and further wherein the diode-connected transistor of the second conductivity type is in the first current path and coupled to a circuit common ground point, and the other transistor of the second conductivity type is in the second current path and coupled to the circuit common ground point; and wherein the current controlling device is positioned in the first current path between the other transistor of the first conductivity type and the other transistor of the second conductivity type.

13. A device for detecting power-up on a supply voltage line comprising;

a power detect circuit controllably coupled to the supply voltage line and which provides a disable signal when power is initially applied to the supply voltage line;

a current mirror coupled to control the power detect circuit and controllably coupled to the supply voltage line, wherein the current mirror provides a control signal and an output signal which disables the power detect circuit and which exceeds a predetermined control level when a voltage on the supply voltage line exceeds a predetermined threshold level;

an amplifier controllably coupled to the supply voltage line, controlled by the disable signal and the control signal, and coupled to receive the current mirror output signal, wherein the amplifer provides a drive signal proportional to the current mirror output signal; and a output-driver/power-down circuit enabled by the drive signal, wherein the output-driver/power-down circuit decouples the power detect circuit, the current mirror and the amplifier from the supply voltage line and provides a reset output signal upon receipt of the drive signal from the amplifier.

14. The device of claim 13 wherein the current mirror includes first and second current paths, wherein current flowing in the first current path is proportional to current flowing in the second path when the current mirror is operational; and a current controlling device positioned in the first current path and controlled by a voltage in the second current path.

15. The device of claim 13 wherein the output-driver/power-down circuit includes a latch circuit which provides the reset output signal when enabled by the drive signal from the amplifier;

a decoupling circuit controlled by a state of the latch circuit which decouples the current mirror, the power detect circuit and the amplifier from the supply voltage line when the reset output signal is present.

16. The device of claim 13 further including a supply voltage transistor which provides a controllable path between the supply voltage line and the power detect circuit, the current mirror, and the amplifier, and further wherein the output-driver/power-down circuit includes a first inverter having an output connected to an input of a second inverter; and first and second feedback transistors, each coupled to be controlled by the output of the first inverter, wherein the first feedback transistor is coupled to provide a feedback path between an output of the second inverter and an input of the first inverter, and further wherein the second feedback transistor is coupled to provide a path from the output of the second inverter to the supply voltage transistor, so that the controllable path provided by the supply voltage transistor is controlled by a signal which is fed back by the second feedback transistor.

17. The device of claim 13 wherein the power detect circuit comprises a gating transistor coupled to the voltage supply line and controlled by the output signal from the current mirror, wherein the gating transistor is sized to be operational at a lower voltage level on the supply voltage line than circuitry within the current mirror and the amplifier, and further wherein the gating transistor is operational in the absence of the output signal from the current mirror, and disabled in the presence of the output signal from the current mirror.

18. The device of claim 13 wherein the amplifier circuit comprises first and second current paths, wherein current in the second current path is proportional to current in the first current path when the amplifier is operational; and a current gating transistor positioned to control current flowing in the first current path as a function of the output signal from the current mirror, and coupled to be disabled by the disable signal from the power detect circuit and enabled by the output signal from the current mirror.

19. The device of claim 14 wherein the current mirror comprises first and second transistors of a first conductivity type, wherein one of the first and second transistors of the first conductivity type is diode-connected;

first and second transistors of a second conductivity type which is different from the first conductivity type, wherein one of the first and second transistors of the second conductivity type is diode-connected;

further wherein the diode-connected transistor of the first conductivity type is in the second current path and coupled to the supply voltage line, and the other transistor of the first conductivity type is in the first current path and coupled to the supply voltage line; and further wherein the diode-connected transistor of the second conductivity type is in the second current path and coupled to a circuit common ground point, and the other transistor of the second conductivity type is in the first current path and coupled to the circuit common ground point; and wherein the current controlling device is positioned in the first current path between the other transistor of the first conductivity type and the other transistor of the second conductivity type.

20. The device of claim 14 wherein the current mirror comprises first and second transistors of a first conductivity type, wherein one of the first and second transistors of the first conductivity type is diode-connected;

first and second transistors of a second conductivity type which is different from the first conductivity type, wherein one of the first and second transistors of the second conductivity type is diode-connected;

further wherein the diode-connected transistor of the first conductivity type is in the second current path and coupled to the supply voltage line, and the other transistor of the first conductivity type is in the first current path and coupled to the supply voltage line; and further wherein the diode-connected transistor of the second conductivity type is in the first current path and coupled to a circuit common ground point, and the other transistor of the second conductivity type is in the second current path and coupled to the circuit common ground point; and wherein the current controlling device is positioned in the first current path between the other transistor of the first conductivity type and the other transistor of the second conductivity type.

* * * * *